(12) United States Patent
Hsieh et al.

(10) Patent No.: US 9,324,453 B2
(45) Date of Patent: Apr. 26, 2016

(54) MEMORY UNIT AND METHOD OF TESTING THE SAME

(71) Applicant: TAIWAN SEMICONDUCTOR MANUFACTURING COMPANY, LTD., Hsinchu (TW)

(72) Inventors: Wei-Jer Hsieh, Hsinchu (TW); Hong-Chen Cheng, Hsinchu (TW); Chiting Cheng, Taichung (TW); Yangsyu Lin, New Taipei (TW); Cheng Hung Lee, Hsinchu (TW); Jonathan Tsung-Yung Chang, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/222,018

(22) Filed: Mar. 21, 2014

(65) Prior Publication Data
US 2015/0269991 A1    Sep. 24, 2015

(51) Int. Cl.
*G11C 11/00* (2006.01)
*G11C 29/32* (2006.01)
*G11C 11/41* (2006.01)

(52) U.S. Cl.
CPC ............... *G11C 29/32* (2013.01); *G11C 11/41* (2013.01)

(58) Field of Classification Search
CPC .... G11C 16/26; G11C 16/28; G11C 11/4097; G11C 16/0483; G11C 16/08; G11C 16/24; G11C 5/063
USPC ................... 365/154, 185.21, 189.01, 45, 63, 365/185.03, 185.22
See application file for complete search history.

(56) References Cited

U.S. PATENT DOCUMENTS 5,598,421 A * 1/1997 Tran et al. ..................... 714/726

\* cited by examiner

*Primary Examiner* — Thong Q Le
(74) *Attorney, Agent, or Firm* — Hauptman Ham, LLP

(57) ABSTRACT

A memory unit that includes a tracking unit, a scan chain and a scan chain control unit. The tracking unit includes a tracking bit line, wherein the tracking unit is configured to receive a tracking control signal, selectively charge or discharge a voltage on the tracking bit line in response to the tracking control signal and generate a sense amplifier signal. The scan chain includes one or more logic devices, wherein the scan chain is configured to receive at least a first control signal. The scan chain control unit is connected to the scan chain and the tracking unit. The scan chain control unit is configured to receive the sense amplifier signal and generate the first scan chain control signal.

20 Claims, 8 Drawing Sheets

MEMORY UNIT AND METHOD OF TESTING THE SAME

BACKGROUND

The semiconductor integrated circuit (IC) industry has produced a wide variety of digital devices to address issues in a number of different areas. Some of these digital devices, such as a system on a chip (SoC) device having a microprocessor, are electrically coupled to static random access memory (SRAM) devices for the storage of digital data. As ICs have become smaller and more complex, operating voltages continue to decrease, thereby affecting IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. The drawings, which are incorporated herein, include the following in which.

DETAILED DESCRIPTION

Figure 1:
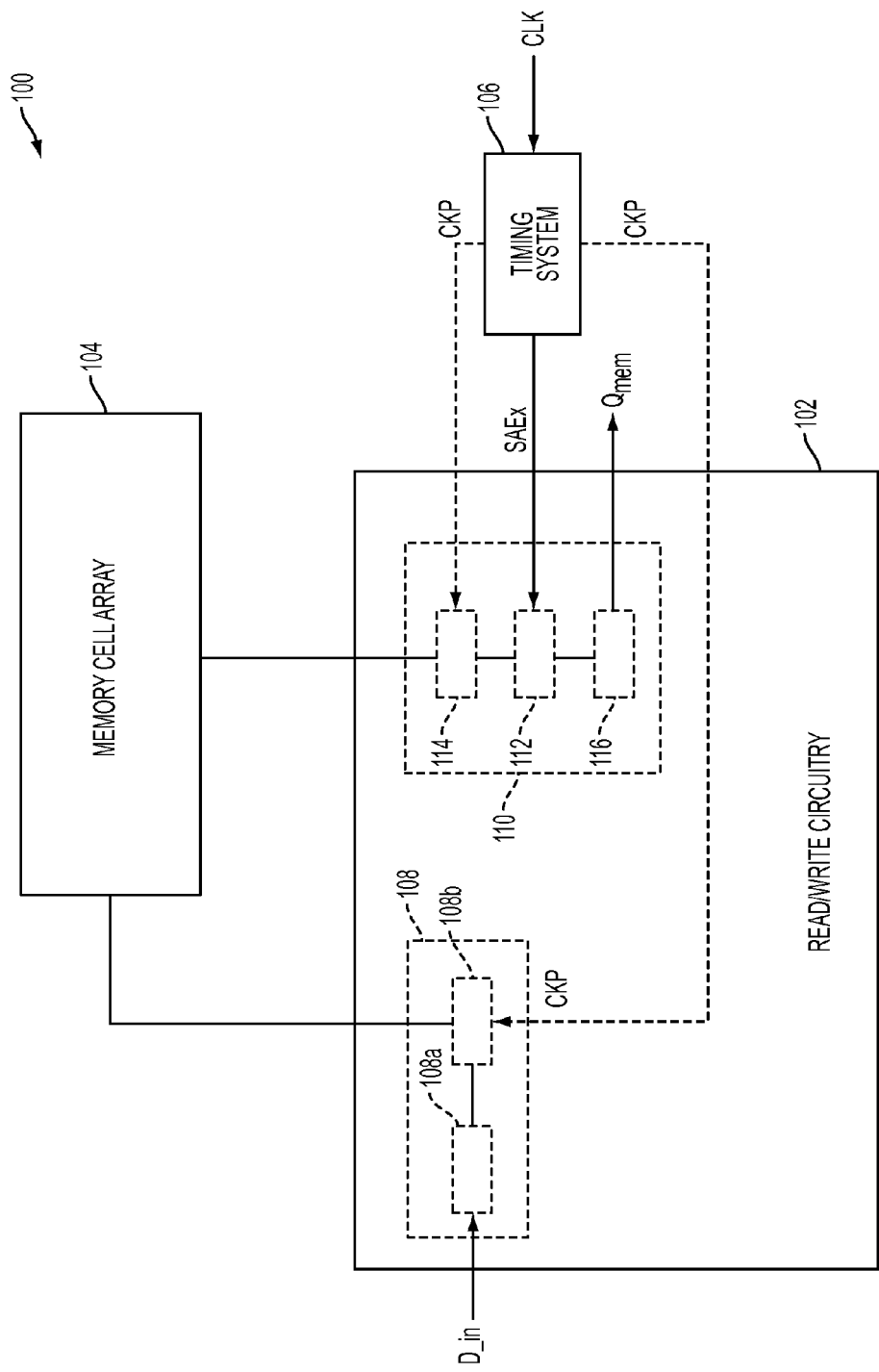
FIG. 1 is a block diagram of a memory unit in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms concerning attachments, coupling and the like, such as "connected" and "interconnected," refer to a relationship wherein components are attached to one another either directly or indirectly through intervening components, unless expressly described otherwise.

FIG. 1 is a block diagram of a memory unit 100 in accordance with one or more embodiments. Memory unit 100 comprises a read/write circuitry 102, memory cell array 104 and timing system 106. In some embodiments, memory unit 100 is a static random-access memory (SRAM).

Read/write circuitry 102 is coupled to memory cell array 104 and timing system 106. In some embodiments, read/write circuitry 102 is configured to read data from the memory cell array 104 or to write data to the memory cell array 104. The memory cell array 104 stores data accessible by read/write circuitry 106. The timing system 106 controls the timing of read/write circuitry 102. In some embodiments, the timing system 106 is configured to generate a sense amplifier enable (SAEx) signal in response to one or more clock signals CLK. In some embodiments, timing system 106 is configured to send one or more delayed clock signal CKP.

Read/write circuitry 102 comprises an input interface 108 and an output interface 110.

Input interface 108 comprises one or more input latches 108a and row decoder 108b. Input interface 108 is configured to receive an input data. In some embodiments, the input data comprises data to be written to the memory cell array 104. In some embodiments, the input data comprises address data corresponding to the location of one or more memory cells in the memory cell array 104.

One or more input latches 108a are connected to row decoder 108b. One or more input latches 108a are configured to receive input data D_in. In some embodiments, one or more input latches 108a are configured to buffer received input data D_in. In some embodiments, one or more input latches 108a are configured to output received input data D_in to row decoder 108b.

Row decoder 108b is connected to one or more input latches 108a, memory cell array 104 and timing system 106. In some embodiments, row decoder 108b is configured to provide the X- or row-address of memory cell array 104 to be accessed for a read or write operation. In some embodiments, row decoder 108b is configured to receive a delayed clock signal CKP. In some embodiments, the delayed clock signal CKP triggers the row decoder 108b to provide access for a read or write operation of memory cell array 104.

Output interface 110 comprises a sense amplifier 112, column decoder 114 and one or more output latches 116. Output interface 110 is configured to send output data. In some embodiments, the output data comprises data to be read from the memory cell array 104 (i.e. Qmem). In some embodiments, the output data comprises address data corresponding to the location of one or more memory cells in the memory cell array 104. Output interface 110 is configured to receive a sense amplifier signal SAEx from the timing system 106. In some embodiments, the received sense amplifier signal SAEx triggers the output interface 110 to read data from the memory cell array 104.

Column decoder 114 is connected to sense amplifier 112, memory cell array 104 and timing system 106. In some embodiments, column decoder 114 is configured to provide the Y- or column-address of memory cell array 104 to be accessed for a read or write operation. In some embodiments, column decoder 114 is configured to receive a delayed clock signal CKP. In some embodiments, the delayed clock signal CKP triggers the column decoder 114 to provide access for a read or write operation of memory cell array 104.

Sense amplifier 112 is configured to sense the data stored in the memory cell array 104. In some embodiments, the sense amplifier 112 is configured to receive the sense amplifier signal SAEx, which triggers the sense amplifier 112 to read data contained in the memory cell array 104. In some embodiments, the sense amplifier 112 refreshes data contained in the memory cell array 104. In some embodiments, a received sense amplifier signal SAEx with a high logical value results in the sense amplifier 112 to perform a read operation of memory cell array 104. In some embodiments, a received sense amplifier signal SAEx with a low logical value results in the sense amplifier 112 being configured to perform a read operation of memory cell array 104. In some embodiments, sense amplifier 112 comprises one or more sense amplifier drivers.

One or more output latches 116 are connected to sense amplifier 112. One or more output latches 116 are configured to receive data from sense amplifier 112. In some embodiments, one or more output latches 116 are configured to buffer received data. In some embodiments, one or more input latches 108a are configured to output data Qmem.

In some embodiments, memory unit 100 is used for a read operation of one or more memory cells located in memory cell array 104. In some embodiments, memory unit 100 is used for a write operation of one or more memory cells located in memory cell array 104. In some embodiments, memory unit 100 is used for a verification stage of a write operation of one or more memory cells located in memory cell array 104.

Figure 2:
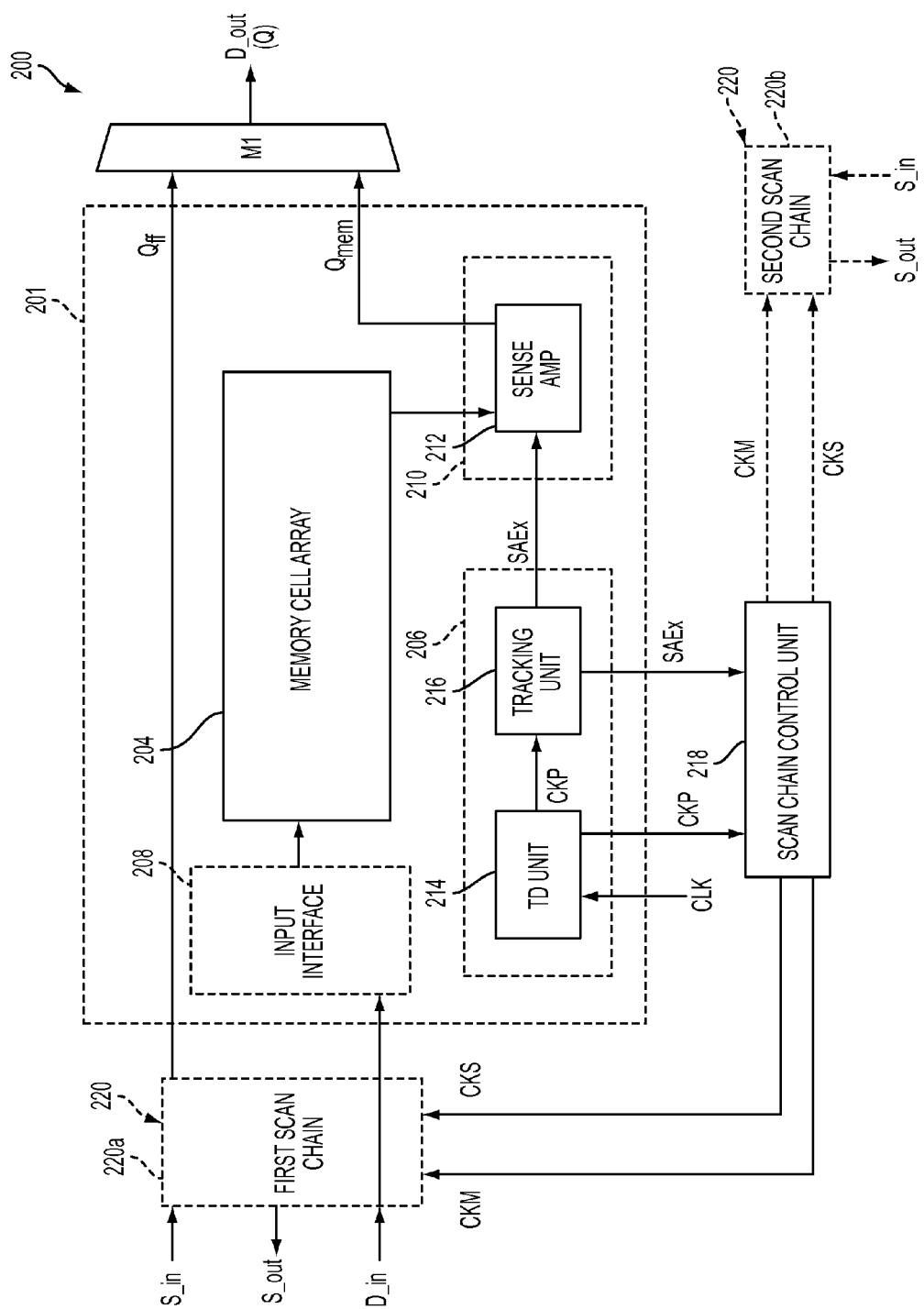
FIG. 2 is a block diagram of a memory unit in accordance with one or more embodiments.

FIG. 2 is a block diagram of a memory unit 200 in accordance with one or more embodiments. Memory unit 200 is an embodiment of the memory unit 100 shown in FIG. 1. As shown in FIG. 2, similar elements have a same reference number as shown in FIG. 1 increased by 100. In comparison with memory unit 100 (shown in FIG. 1), memory unit 200 also comprises a memory core 201, a timer decoder (TD) unit 214, a tracking unit 216, a scan chain control unit 218, a scan chain 220 and a multiplexer M1. In FIG. 2, one or more input latches 108a, row decoder 108b, column decoder 114 and one or more output latches 116 are not shown. Memory unit 200 is configured to output a data signal D_out (Q). In some embodiments, memory unit 200 is an SRAM.

Memory core 201 comprises memory cell array 204, timing system 206, input interface 208 and output interface 210.

Timing system 206 comprises TD unit 214 and tracking unit 216. Timing system 206 is configured to receive a clock signal CLK. Timing system 206 is configured to output a delayed clock signal CKP to scan chain control unit 218. Timing system 206 is configured to output the sense amplifier signal SAEx to sense amplifier 212 or scan chain control unit 218.

TD Unit 214 is connected to tracking unit 216 and scan chain control unit 218. TD unit 214 is configured to receive a clock signal CLK. TD unit 214 is configured to output a delayed clock signal CKP to tracking unit 216 or scan chain control unit 218. In some embodiments, TD unit 214 is configured to output the delayed clock signal CKP to input interface 208. In some embodiments, TD unit 214 is configured to output the delayed clock signal CKP to output interface 210. In some embodiments, TD unit 214 includes a clock generator. In some embodiments, TD unit 214 includes one or more timing circuits. In some embodiments, TD unit 214 includes one or more decoder circuits.

Tracking unit 216 is connected to TD Unit 214, scan chain control unit 218 and sense amplifier 212. Tracking unit 216 is configured to receive delayed clock signal CKP. In some embodiments, delayed clock signal CKP is a tracking control signal for tracking unit 216. Tracking unit 216 is configured to output the sense amplifier signal SAEx to sense amplifier 212 or scan chain control unit 218. In some embodiments, the delayed clock signal CKP triggers the tracking unit 216 to generate sense amplifier signal SAEx. In some embodiments, the tracking unit 216 is configured to control the timing of the sense amplifier 212 or the scan chain control unit 218. In some embodiments, the tracking unit 216 generates a clock signal (e.g., the sense amplifier signal SAEx) which triggers the sense amplifier 212. In some embodiments, the tracking unit 216 generates a clock signal (e.g., the sense amplifier signal SAEx) which triggers the scan control unit 218.

Scan chain control unit 218 is connected to memory core 201 and scan chain 220. Scan chain control unit 218 is connected to TD unit 214, tracking unit 216 and scan chain 220. Scan chain control unit 218 is configured to receive delayed clock signal CKP or sense amplifier signal SAEx. Scan chain control unit 218 is configured to output a first scan chain control signal CKM or a second scan chain control signal CKS. In some embodiments, the sense amplifier signal SAEx triggers the scan chain control unit 218 to generate the first scan chain control signal CKM or the second scan chain control signal CKS. In some embodiments, scan chain control unit 218 is configured to send the first scan chain control signal CKM or the second scan chain control signal CKS to a first scan chain 220a. In some embodiments, scan chain control unit 218 is configured to send the first scan chain control signal CKM or the second scan chain control signal CKS to a second scan chain 220b. In some embodiments, the first scan chain control signal CKM is a first clock signal for the scan chain 220. In some embodiments, the second scan chain control signal CKS is a second clock signal for the scan chain 220.

Scan chain 220 is connected to memory core 201 and scan chain control unit 218. Scan chain 220 is connected to input interface 208, scan chain control unit 218 and multiplexer M1. In some embodiments, the scan chain 220 is configured to perform one or more scan chain tests of memory unit 200. In some embodiments, the one or more scan chain tests observe one or more logic devices contained in the memory unit 200. In some embodiments, the one or more scan chain tests observe one or more flip-flops contained in the memory unit 200. In some embodiments, the one or more scan chain tests observe one or more latches contained in the memory unit 200. In some embodiments, during a scan chain test mode, the memory cell 204 is deactivated, and the memory unit 200 is configured to output a bypass signal $Q_{mem}$ as the output data signal D_out (Q). In some embodiments, during a read/write mode, the memory cell 204 is activated, and the memory unit 200 is configured to output a signal $Q_{mem}$ as the output data signal D_out (Q). In some embodiments, memory core 201, scan chain controller 218, scan chain 220 and multiplexer M1 together form an embedded scan chain SRAM device.

In some embodiments, scan chain 220 comprises one or more logic devices. In some embodiments, scan chain 220 comprises two or more logic devices connected in a sequential chain. In some embodiments, scan chain 220 comprises one or more flip-flop devices. In some embodiments, scan chain 220 comprises two or more flip-flop devices connected in a sequential chain. In some embodiments, scan chain 220 comprises two or more latch devices connected in a sequential chain. Scan chain 220 comprises a first scan chain 220a and a second scan chain 220b. In some embodiments, first scan chain 220a and second scan chain 220b are configured to form a single scan chain (e.g., scan chain 220 as shown in FIG. 2). In some embodiments, first scan chain 220a and second scan chain 220b are configured to form two or more separate scan chains.

First scan chain 220a is connected to the input interface 208 and the scan chain control unit 218. First scan chain 220a is configured to receive input scan data S_in. First scan chain 220a is configured to receive input data D_in. First scan chain 220a is configured to receive the first scan chain control signal CKM or the second scan chain control signal CKS from the scan chain control unit 218. First scan chain 220a is configured to output the received input data D_in to the input interface 208. First scan chain 220a is configured to output scan data S_out. In some embodiments, the first scan chain control signal CKM or the second scan chain control signal CKS triggers the first scan chain 220a to generate the output scan data S_out. First scan chain 220a is configured to output a bypass signal $Q_{ff}$ to a multiplexer M1. In some embodiments, the bypass signal $Q_{ff}$ is substantially equal to scan data S_out.

In some embodiments, the first scan chain control signal CKM is a first clock signal for the first scan chain 220a or the second scan chain 220b. In some embodiments, the second scan chain control signal CKS is a second clock signal for the first scan chain 220a or the second scan chain 220b.

Second scan chain 220b is connected to the scan chain control unit 218. Second scan chain 220b is configured to receive input scan data S_in. Second scan chain 220b is configured to receive the first scan chain control signal CKM or the second scan chain control signal CKS from the scan chain control unit 218. Second scan chain 220b is configured to output scan data S_out. In some embodiments, the first scan chain control signal CKM or the second scan chain control signal CKS triggers the second scan chain 220b to generate the output scan data S_out. In some embodiments, the second scan chain 220b is optional.

Multiplexer M1 is connected to memory core 201 (by output interface 210) and first scan chain 220a. Multiplexer M1 is configured to receive a bypass signal $Q_{ff}$ from the first scan chain 220a. Multiplexer M1 is configured to receive a signal $Q_{mem}$ from the output interface 210. Multiplexer M1 is configured to output a data signal D_out (Q) from the memory unit 200. In some embodiments, the output data signal D_out (Q) is substantially equal to the signal $Q_{mem}$ received from the output interface 210. In some embodiments, the output data signal D_out (Q) is substantially equal to the bypass signal $Q_{ff}$ received from the first scan chain 220a. In some embodiments, during a scan chain test mode the memory cell array 204 is deactivated, and the multiplexer M1 is configured to output the bypass signal $Q_{ff}$ received from the first scan chain 220a as the data signal D_out (Q). In some embodiments, during a read/write mode the memory cell array 204 is activated, and the multiplexer M1 is configured to output the signal $Q_{mem}$ received from the output interface 210.

Figure 3:
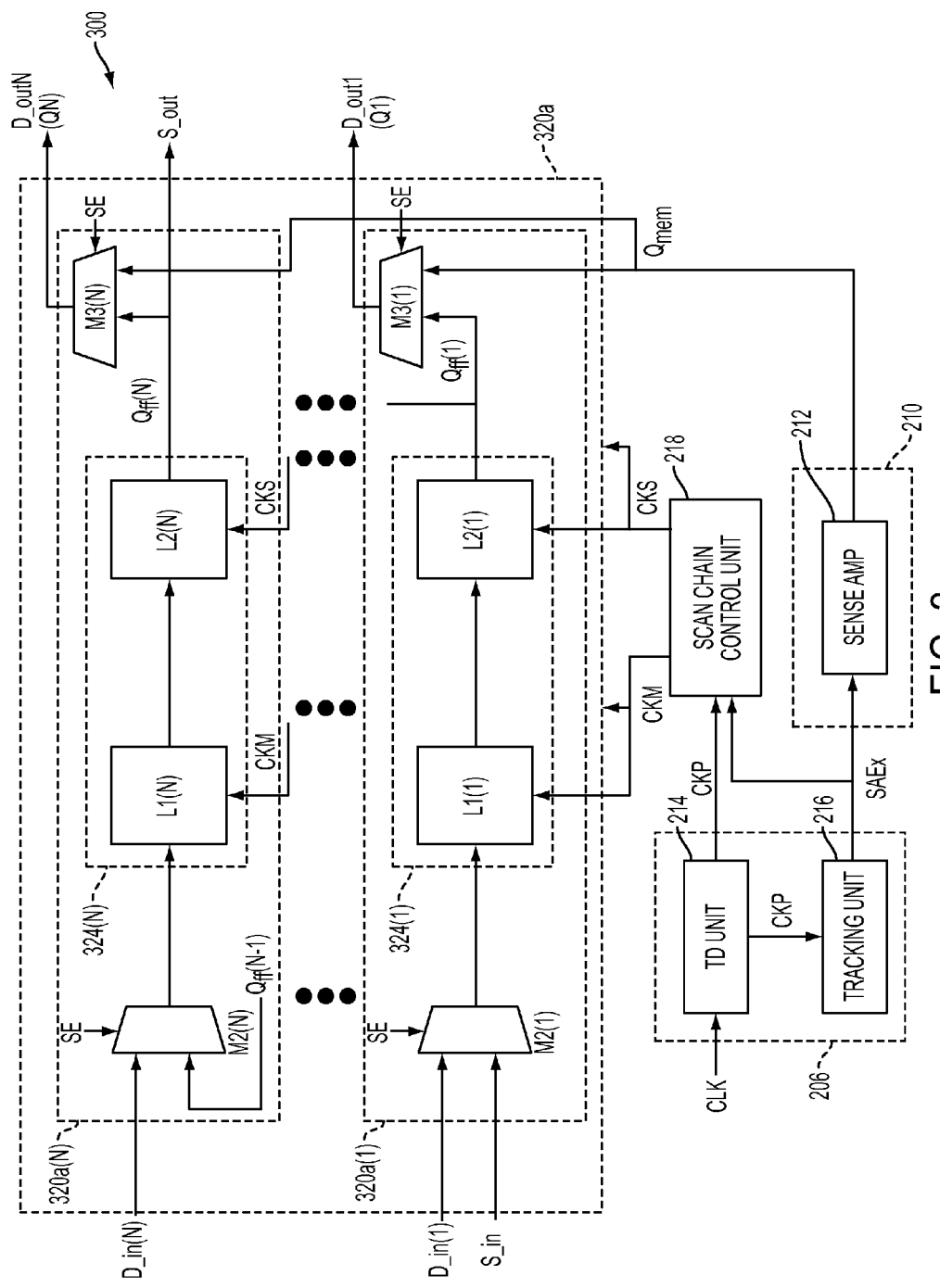
FIG. 3 is a schematic diagram of a portion of a memory unit in accordance with one or more embodiments.

FIG. 3 is a block diagram of a memory unit 300 in accordance with one or more embodiments. Memory unit 300 is an embodiment of the memory unit 200 shown in FIG. 2. As shown in FIG. 3, similar elements have a same reference number as shown in FIG. 2. Memory unit 300 is an embodiment of memory unit 200. In FIG. 3, memory cell array 204, input interface 208, second scan chain 220b and multiplexer M1 are not shown. First scan chain 320a is an embodiment of first scan chain 220a shown in FIG. 2. In some embodiments, first scan chain 320a comprises one or more flip-flop devices connected in a series configuration.

First scan chain 320a comprises one or more first scan chain stages 320a(1), . . . 320a(N), where N is an integer corresponding to the number of stages in the first scan chain 320a. In some embodiments, N is an integer ranging from 1 to 72. In some embodiments, each of the first scan chain stages 320a(1), . . . 320a(N) is connected in series with each other.

First scan chain 320a comprises one or more input multiplexers M2(1), . . . M2(N), one or more flip-flops 324(1), . . . 324(N) and one or more output multiplexers M3(1), . . . M3(N), where N is an integer corresponding to the number of stages in the first scan chain 320a.

First scan chain stage 320a(1) comprises input multiplexer M2(1), flip-flop 324(1) and output multiplexer M3(1). First scan chain stage 320a(1) is configured to receive input scan data S_in or input data D_in(1). First scan chain stage 320a(1) is configured to output data signal D_out(1) (Q1). In some embodiments, first scan chain stage 320a(1) is configured to output bypass signal $Q_{ff}(1)$ to the subsequent first scan chain stage 320a(N). In some embodiments, if N is equal to 1 such that the first scan chain 320a comprises a single scan chain stage 320a(1), the first scan chain stage 320a(1) is configured to output scan data S_out. In these embodiments, the bypass signal $Q_{ff}(1)$ is substantially equal to scan data S_out.

Input multiplexer M2(1) is connected to the flip-flop 324(1). Input multiplexer M2(1) is configured to receive input scan data S_in or input data D_in(1). Input multiplexer M2(1) is configured to receive a scan enable signal SE. In some embodiments, the scan enable signal SE is e.g., a low logical value or a high logical value. Input multiplexer M2(1) is configured to output a signal to the flip-flop 324(1). In some embodiments, the scan enable signal SE controls the operation of the input multiplexer M2(1). In some embodiments, the logical value of scan enable signal SE determines which input signal (e.g., input scan data S_in or input data D_in(1)) is forwarded as the output signal of the input multiplexer M2(1). In some embodiments, a scan enable signal SE of a high logical value results in an input signal of input scan data S_in being forwarded as the output signal of the input multiplexer M2(1). In some embodiments, a scan enable signal SE of a low logical value results in an input signal of input data D_in(1) being forwarded as the output signal of the input multiplexer M2(1).

Flip-flop 324(1) is connected to the input multiplexer M2(1), output multiplexer M3(1) and scan chain control unit 218. Flip-flop 324(1) is configured to receive an input signal (e.g., input scan data S_in or input data D_in(1)) from input multiplexer M2(1). Flip-flop 324(1) is configured to receive the first scan chain control signal CKM or the second scan chain control signal CKS from the scan chain control unit 218. Flip-flop 324(1) is configured to output the bypass signal $Q_{ff}(1)$ to the output multiplexer M3(1). In some embodiments, flip-flop 324(1) is a bistable multivibrator. In some embodiments, flip-flop 324(1) is a D type flip-flop. In some embodiments, if the edge of the first scan chain control signal CKM or the second scan chain control signal CKS transitions from a low logical signal to a high logical signal, the output of the flip-flop 324(1) (e.g., bypass signal $Q_{ff}(1)$) changes. In some embodiments, if the edge of the first scan chain control signal CKM or the second scan chain control signal CKS transitions from a high logical signal to a low logical signal, the output of the flip-flop 324(1) (e.g., bypass signal $Q_{ff}(1)$) changes. Flip-flop 324(1) comprises a first latch L1(1) and a second latch L2(1).

First latch L1(1) is connected to input multiplexer M2(1), second latch L2(1) and scan chain control unit 218. In some embodiments, first latch L1(1) and second latch L2(1) are connected in a series configuration. First latch L1(1) is configured to receive an input signal (e.g., input scan data S_in or input data D_in(1)) from input multiplexer M2(1). First latch L1(1) is configured to receive the first scan chain control signal CKM from the scan chain control unit 218. First latch L1(1) is configured to output a signal to the second latch L2(1). In some embodiments, the first latch L1(1) is configured as a low-latch or a high-latch. In some embodiments, if the first scan chain control signal CKM is a low logical signal and the first latch L1(1) is configured as a low-latch, the input signal received from the input multiplexer M2(1) is output to the second latch L2(1) by the first latch L1(1). In some embodiments, if the first scan chain control signal CKM is a high logical signal and the first latch L1(1) is configured as a high-latch, the input signal received from the input multiplexer M2(1) is output to the second latch L2(1) by the first latch L1(1). In some embodiments, the first scan chain control signal CKM is a clock signal for the first latch L1(1).

Second latch L2(1) is connected to first latch L1(1), scan chain control unit 218 and output multiplexer M3(1). Second latch L2(1) is configured to receive an input signal from first latch L1(1). Second latch L2(1) is configured to receive the second scan chain control signal CKS from the scan chain control unit 218. Second latch L2(1) is configured to output bypass signal $Q_{ff}(1)$ to the output multiplexer M3(1). In some embodiments, second latch L2(1) is configured to output bypass signal $Q_{ff}(1)$ to the subsequent first scan chain stage 320a(N).

In some embodiments, the second latch L2(1) is configured as a low-latch or a high-latch. In some embodiments, if the second scan chain control signal CKS is a low logical signal and the second latch L2(1) is configured as a low-latch, the input signal received from the first latch L1(1) is output by the second latch L2(1) to the output multiplexer M3(1). In some embodiments, if the second scan chain control signal CKS is a high logical signal and the second latch L2(1) is configured as a high-latch, the input signal received from the first latch L1(1) is output by the second latch L2(1) to the output multiplexer M3(1). In some embodiments, the second scan chain control signal CKS is a clock signal for the second latch L2(1).

Output multiplexer M3(1) is connected to the flip-flop 324(1) and the output interface 210 (by sense amplifier 212). In some embodiments, the output multiplexer M3(1) is connected to the second latch L2(1). Output multiplexer M3(1) is configured to receive bypass signal $Q_{ff}(1)$ from flip-flip 324(1). In some embodiments, the output multiplexer M3(1) is configured to receive bypass signal $Q_{ff}(1)$ from second latch L2(1). Output multiplexer M3(1) is configured to receive signal $Q_{mem}$ from sense amplifier 212. Output multiplexer M3(1) is configured to output data signal D_out 1(Q1). Output multiplexer M3(1) is configured to receive a scan enable signal SE. In some embodiments, the scan enable signal SE is e.g., a low logical value or a high logical value. Output multiplexer M3(1) is configured to output data signal D_out1 (Q1). In some embodiments, the scan enable signal SE controls the operation of the output multiplexer M3(1). In some embodiments, the logical value of scan enable signal SE determines which input signal (e.g., bypass signal Qff(1) or signal Qmem) is forwarded as the output signal of the output multiplexer M3(1).

Each of the connections for first scan chain stage 320a(1) repeat for each subsequent stage of the first scan chain stage 320a(N) contained in first scan chain 320a.

The last stage of the first scan chain stage 320a(N) is configured to receive bypass signal $Q_{ff}(N-1)$ from the previous first scan chain stage 320a(N-1). The last stage of the first scan chain stage 320a(N) is configured to receive input data signal D_in(N). The last stage of the first scan chain stage 320a(N) is configured to output data signal D_outN(QN). In some embodiments, the last stage of the first scan chain stage 320a(N) is configured to output a scan signal S_out.

Figure 4:
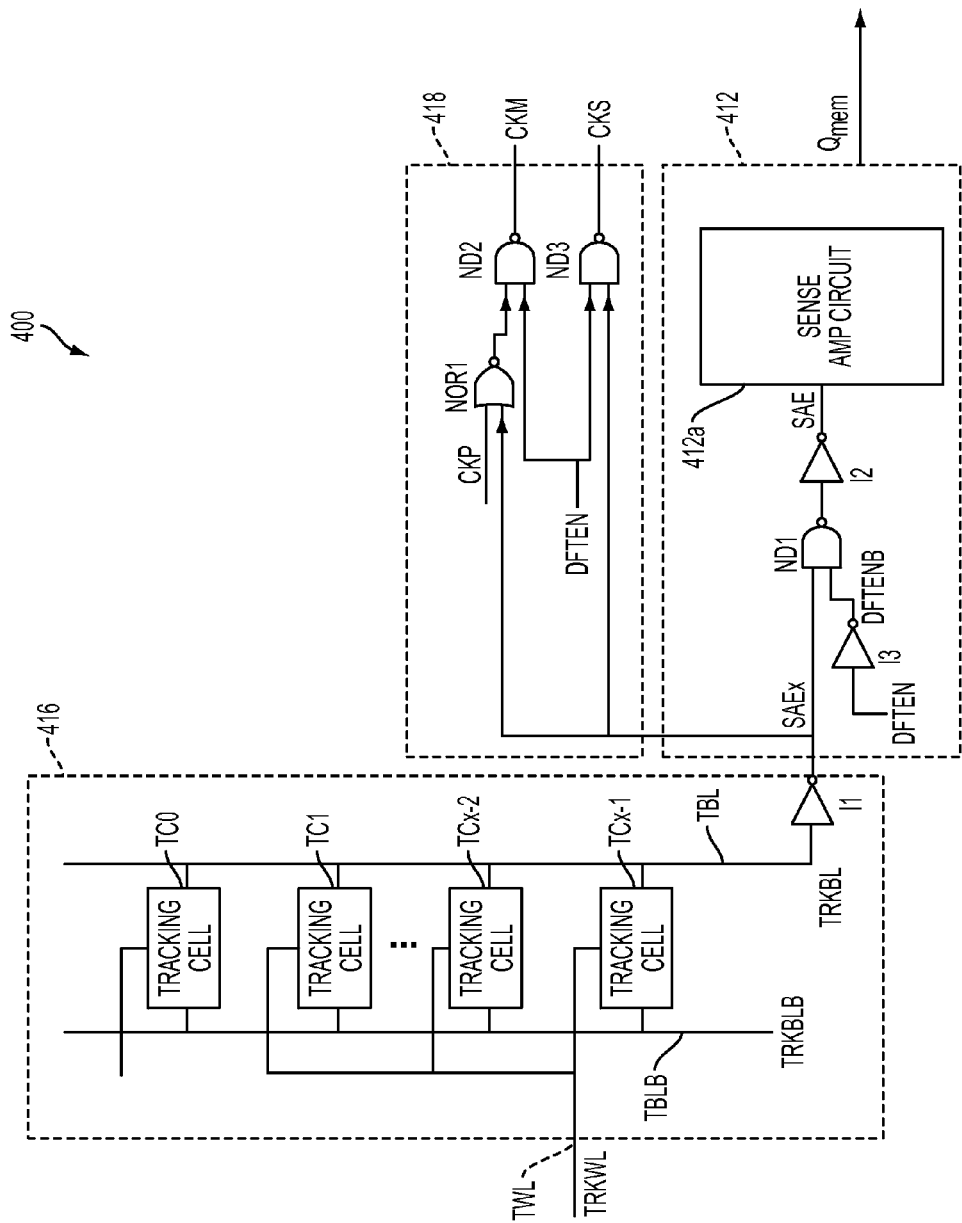
FIG. 4 is a schematic diagram of a portion of a memory unit in accordance with one or more embodiments.

FIG. 4 is a schematic diagram of a portion of a memory unit 400 in accordance with one or more embodiments. Memory unit 400 is an embodiment of the memory unit 200 shown in FIG. 2. As shown in FIG. 4, similar elements have a same reference number as shown in FIG. 2 increased by 200. Memory unit 400 is an embodiment of memory unit 200. In FIG. 4, memory cell array 204, input interface 208, TD unit 214, scan chain 220 and multiplexer M1 are not shown. Sense amplifier 412 is an embodiment of sense amplifier 212 shown in FIG. 2. Tracking unit 416 is an embodiment of tracking unit 216 shown in FIG. 2. Scan control unit 418 is an embodiment of scan control unit 218 shown in FIG. 2.

Tracking unit 416 comprises inverter I1 and one or more tracking cells TC0, . . . TCx-1 where x is an integer corresponding to the number of tracking cells stages in the tracking unit 416. In some embodiments, x is an integer ranging from 1 to 256. In some embodiments, a tracking cell (e.g. tracking cell TC0, . . . TCx-1) in tracking unit 416 comprises one or more memory cells. Tracking unit 416 is configured to receive a wordline control signal on the tracking world line TWL. Tracking unit 416 is configured to output a sense amplifier signal SAEx to sense amplifier 412 and scan control unit 418.

One or more tracking cells TC0, . . . TCx-1 are connected to an inverter I1. One or more tracking cells TC0, . . . TCx-1 are configured to receive a wordline control signal TRKWL. In some embodiments, tracking cell TC0 is configured to receive a wordline control signal substantially equal to a low logical value. In some embodiments, tracking cells TC1, . . . TCx-1 are configured to receive a wordline control signal TRKWL on the tracking world line TWL. In some embodiments, wordline signal TRKWL is a voltage signal that ranges from a low logical value to a high logical value and varies with time. One or more tracking cells TC0, . . . TCx-1 are configured to output a bitline signal TRKBL on the tracking bit line TBL to inverter I1. In some embodiments, bitline signal TRKBL is a voltage signal that ranges from a low logical value to a high logical value and varies with time. One or more tracking cells TC0, . . . TCx-1 are configured to output a bitline bar signal TRKBLB on the tracking bit line bar TBLB. In some embodiments, bitline bar signal TRKBLB is a voltage signal that ranges from a low logical value to a high logical value and varies with time. In some embodiments, one or more tracking cells TC0, . . . TCx-1 are configured to receive a tracking control signal (e.g., wordline signal TRKWL). In some embodiments, one or more tracking cells TC0, . . . TCx-1 are configured to selectively charge or discharge a voltage on a tracking bit line TBL in response to the tracking control signal. In some embodiments, one or more tracking cells TC0, . . . TCx-1 are configured to generate the sense amplifier signal SAEx in response to the voltage on the tracking bit line TBL. In some embodiments, the sense amplifier signal SAEx signal is activated to trigger the sense amplifier 412 after the difference of the voltage levels of the tracking bit line BL and tracking bit line bar BLB coupled to the one or more tracking cells TC0, . . . TCx-1 is sufficient to be distinguished by the sense amplifier 412.

Inverter I1 is connected to one or more tracking cells TC0, . . . TCx-1 where x is an integer corresponding to the number of tracking cells stages in the tracking unit 416. In some embodiments, inverter I1 is configured to receive a bitline signal TRKBL on the tracking bit line TBL. Inverter I1 is configured to output a sense amplifier signal SAEx to sense amplifier 412 and scan control unit 418.

Sense amplifier 412 comprises a NAND gate ND1, an inverter I2, an inverter I3 and a sense amplifier circuit 412a. The sense amplifier 412 is configured to receive a sense amplifier signal SAEx from the tracking unit 416. The sense amplifier 412 is configured to output a signal $Q_{mem}$.

NAND gate ND1 is connected to inverter I1, inverter I2 and inverter I3. NAND gate ND1 is configured to receive the sense amplifier signal SAEx from inverter I1. NAND gate ND1 is also configured to receive an inverted scan chain testing control signal DFTENB from inverter I3. The scan chain testing control signal DFTEN is a low or high logical signal. In some embodiments, if the scan chain testing control signal DFTEN is a low logical value, the NAND gate ND1 is configured to pass the sense amplifier signal SAEx to inverter I2. In some embodiments, if the scan chain testing control signal DFTEN is a low logical value, the memory unit 400 is configured to operate in a read/write mode. In some embodiments, if the scan chain testing control signal DFTEN is a low logical value (the inverted scan chain testing signal DFTENB is a high logical value) and the sense amplifier signal SAEx is a high logical value, the NAND gate ND1 is configured to output a low logical value. In some embodiments, if the NAND gate ND1 is configured to output a low logical value, the inverter I2 is configured to output an SAE signal with a high logical value. In some embodiments, if the scan chain testing control signal DFTEN is a low logical value, the logical value of the SAE signal is controlled by the logical value of the sense amplifier signal SAEx.

In some embodiments, if the scan chain testing control signal DFTEN is a high logical value, the memory unit 400 is configured to operate in a scan chain test mode. In some embodiments, if the scan chain testing control signal DFTEN is a high logical value (the inverted scan chain testing signal DFTENB is a low logical value) and the sense amplifier signal SAEx is a high logical value, the NAND gate ND1 is configured to output a high logical value. In some embodiments, if the NAND gate ND1 is configured to output a high logical value, the inverter I2 is configured to output an SAE signal with a low logical value.

Inverter I3 is connected to NAND gate ND1 and a source of the scan chain testing control signal DFTEN. Inverter I3 is configured to receive the scan chain testing control signal DFTEN. Inverter I3 is configured to output an inverted scan chain testing control signal DFTENB to the NAND gate ND1.

Inverter I2 is connected to NAND gate ND1 and sense amplifier circuit 412a. Inverter I2 is configured to receive the output signal from NAND gate ND1. Inverter I2 is configured to output an inverted signal to the sense amplifier circuit 412a. In some embodiments, the inverted signal is a sense amplifier control signal SAE.

Sense amplifier circuit 412a is connected to inverter I2. Sense amplifier circuit 412a is configured to receive sense amplifier control signal SAE. Sense amplifier circuit 412a is configured to output a signal $Q_{mem}$. Sense amplifier circuit 412a comprises one or more circuit elements. In some embodiments, sense amplifier circuit 412a comprises one or more N-type Metal-Oxide Semiconductor Field Effect (NMOS) transistors or P-type MOS (PMOS) transistors. In some embodiments, during a read operation, the sense amplifier control signal SAE is activated to trigger the sense amplifier circuit 412a after the difference of the voltage levels of the tracking bit line BL and tracking bit line bar BLB coupled to the one or more tracking cells TC0, . . . TCx-1 is sufficient to be distinguished by the sense amplifier circuit 412a.

Scan control unit 418 comprises a NAND gate ND2, a NAND gate ND3 and a NOR gate NOR1. Scan control unit 418 is configured to receive the sense amplifier signal SAEx from the tracking unit 416. Scan control unit 418 is configured to output first scan chain control signal CKM and second scan chain control signal CKS. In some embodiments, the first scan chain control signal CKM is a first clock signal for the scan chain 220. In some embodiments, the second scan chain control signal CKS is a second clock signal for the scan chain 220. In some embodiments, the scan control unit 418 generates the first scan chain control signal CKM or the second scan chain control signal CKS to trigger the scan chain 220.

NOR gate NOR1 is connected to inverter I1, the source of delayed clock signal CKP and NAND gate ND2. NOR gate NOR1 is configured to receive the sense amplifier signal SAEx from inverter I1. NOR gate NOR1 is also configured to receive delayed clock signal CKP. In some embodiments, NOR gate NOR1 is configured to receive delayed clock signal CKP from TD unit 214. NOR gate NOR1 is configured to output a signal to NAND gate ND2.

NAND gate ND2 is connected to NOR gate NOR1 and the source of the scan chain testing control signal DFTEN. NAND gate ND2 is configured to receive the scan chain testing control signal DFTEN. NAND gate ND2 is also configured to receive the signal output from NAND gate ND2. NAND gate ND2 is configured to output the first scan chain control signal CKM.

NAND gate ND3 is connected to inverter I1 and the source of the scan chain testing control signal DFTEN. NAND gate ND3 is configured to receive the scan chain testing control signal DFTEN. NAND gate ND3 is also configured to receive the sense amplifier signal SAEx from inverter IL NAND gate ND3 is configured to output the second scan chain control signal CKS. In some embodiments, if the scan chain testing control signal DFTEN is a low logical value, the NAND gate ND3 is configured to output the second scan chain control signal CKS to be a high logical value. In some embodiments, if the scan chain testing control signal DFTEN is a high logical value, a change in the sense amplifier signal SAEx will trigger a change in the second scan chain control signal CKS.

Figure 5:
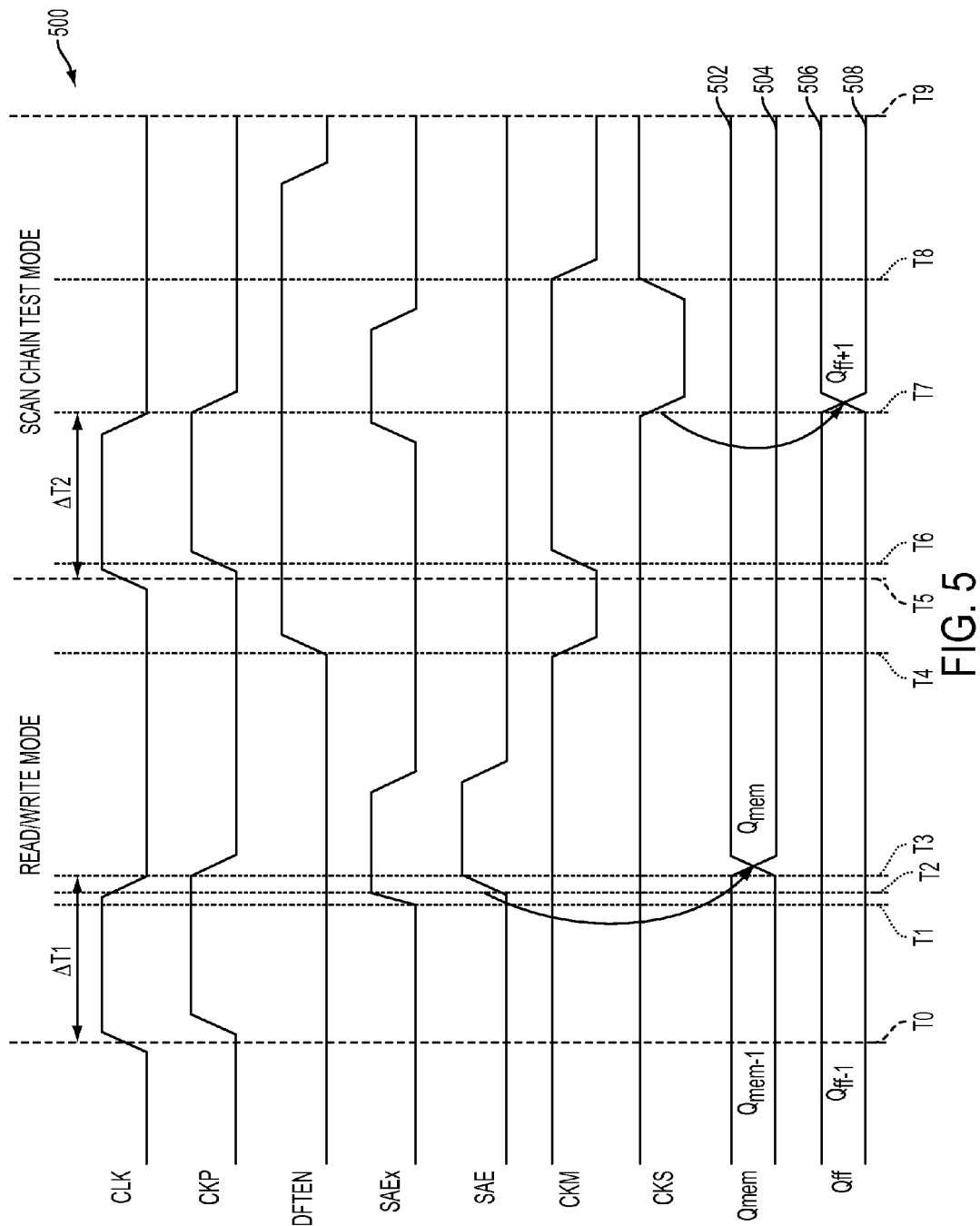
FIG. 5 is a graph of waveforms used to illustrate an operation of the circuit in FIG. 4 in accordance with one or more embodiments.

FIG. 5 is a graph 500 of waveforms of various signals of memory unit 400 shown in FIG. 4, in accordance with one or more embodiments. The graph 500 depicts curves of clock signal CLK, delayed clock signal CKP, scan chain testing control signal DFTEN, a first sense amplifier signal SAEx, a sense amplifier control signal SAE, first scan chain control signal CKM, second scan chain control signal CKS, signal $Q_{mem}$ and bypass signal signal $Q_{ff}$.

As shown in FIG. 5, graph 500 comprises two operation modes (e.g., read/write mode and scan chain test mode) for memory unit 400. In some embodiments, during a read/write mode, the memory cell 204 is not disabled, and the memory unit 400 is configured to output a signal $Q_{mem}$ as the output data signal D_out (Q). In some embodiments, during a scan chain test mode, the memory cell 204 is disabled, and the memory unit 400 is configured to output a bypass signal $Q_{ff}$ as the output data signal D_out (Q).

At T0, the next clock cycle begins.

At time T1, the first sense amplifier signal SAEx transitions from a low logical signal to a high logical signal. Also, at time T1, scan chain testing control signal DFTEN is a low logical signal. In some embodiments, if the scan chain testing control signal DFTEN is a low logical signal, the memory cell array 204 is enabled and a read/write mode is enabled. In some embodiments, the scan chain testing control signal DFTEN triggers the sense amplifier control signal SAE.

At time T2, the sense amplifier control signal SAE transitions from a low logical signal to a high logical signal. In some embodiments, the sense amplifier control signal SAE triggers the memory unit 400 to output signal $Q_{mem}$.

At time T3, the output signal $Q_{mem}$ transitions from a low logical signal to a high logical signal (as shown by curve 502) or from a high logical signal to a low logical signal (as shown by curve 504). The difference in time between time T3 and time T0 is represented as first transition time $\Delta T1$.

At time T4, scan chain testing control signal DFTEN transitions from a low logical signal to a high logical signal. At time T4, first scan chain control signal CKM transitions from a high logical signal to a low logical signal. In some embodiments, if the scan chain testing control signal DFTEN is a high logical signal, the memory cell array 204 is disabled and a scan chain test mode is enabled. In some embodiments, the scan chain testing control signal DFTEN triggers the first scan chain control signal CKM or the second scan chain control signal CKS.

At T5, the next clock cycle begins.

At T6, the first scan chain control signal CKM transitions from a low logical signal to a high logical signal.

At T7, the second scan chain control signal CKS transitions from a high logical signal to a low logical signal. Also, at time T7, the bypass signal $Q_{ff}$ transitions from a low logical signal to a high logical signal (as shown by curve 506) or from a high logical signal to a low logical signal (as shown by curve 508). The difference in time between time T5 and time T7 is represented as second transition time $\Delta T2$.

At T8, the first scan chain control signal CKM transitions from a high logical signal to a low logical signal.

At T9, the next clock cycle begins.

In some embodiments, the first transition time $\Delta T1$ is substantially equal to the second transition time $\Delta T2$. As shown in FIG. 5, the timing of output signal $Q_{mem}$ for a read/write mode is substantially equal to the timing of bypass signal $Q_{ff}$ for a scan chain test mode. In some embodiments, the timing of output signal $Q_{mem}$ for a read/write mode is substantially equal to the timing of bypass signal $Q_{ff}$ for a scan chain test mode without the use of one or more delay units after the memory unit 200.

Figure 6:
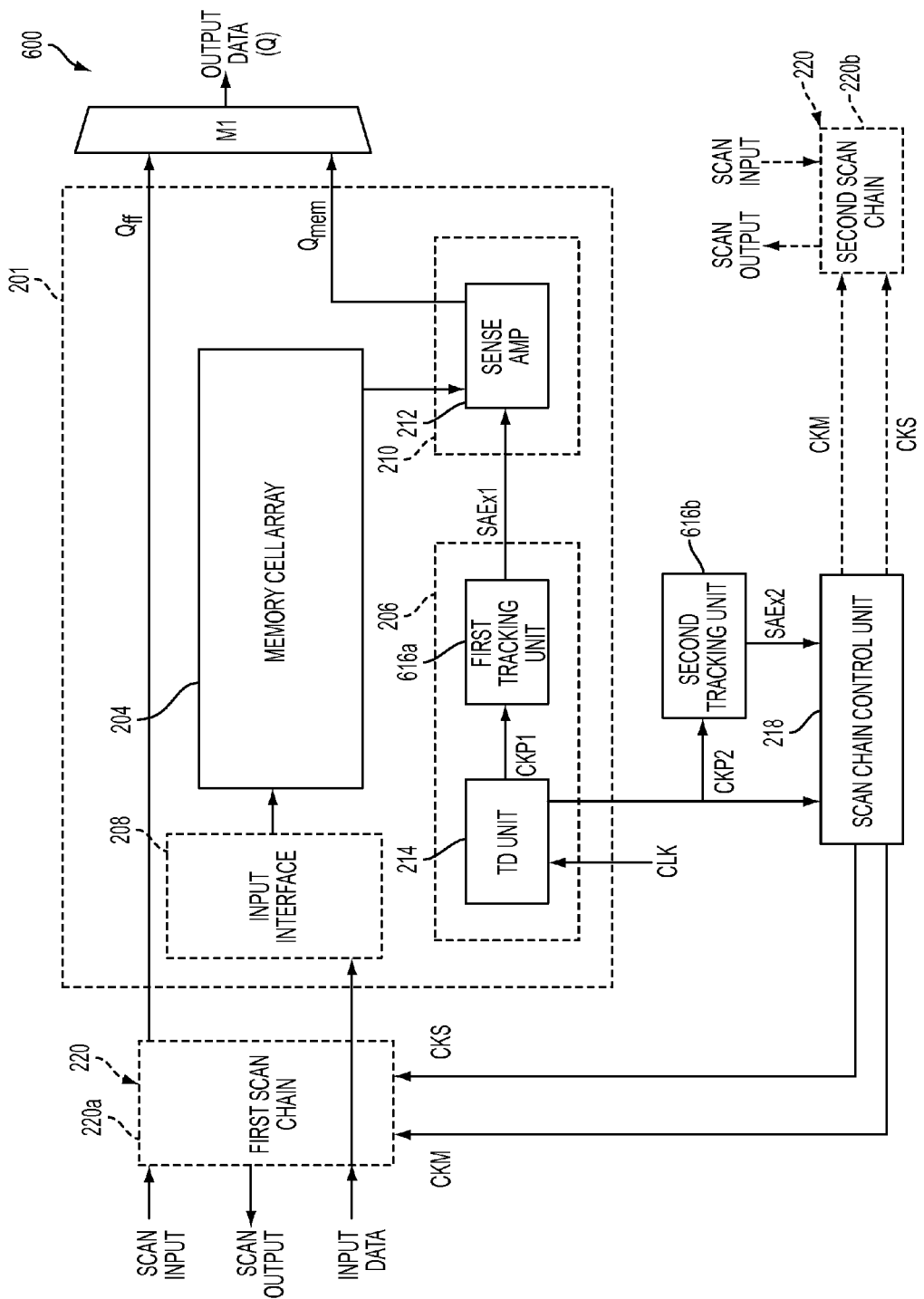
FIG. 6 is a block diagram of a memory unit in accordance with one or more embodiments.

FIG. 6 is a block diagram of a memory unit 600 in accordance with one or more embodiments. Memory unit 600 is an embodiment of the memory unit 200 shown in FIG. 2. As shown in FIG. 6, similar elements have a same reference number as shown in FIG. 2. In comparison with memory unit 200 (shown in FIG. 2), memory unit 600 also comprises a first tracking unit 616a and a second tracking unit 616b.

Memory core 201 comprises memory cell array 204, timing system 206, input interface 208, output interface 210, sense amplifier 212, TD unit 214 and first tracking unit 616a. In some embodiments, memory core 201 further comprises a second tracking unit 616b.

Timing system 206 comprises TD unit 214 and first tracking unit 616a. Timing system 206 is configured to receive a clock signal CLK. Timing system 206 is configured to output a first delayed clock signal CKP1 to first tracking unit 616a. Timing system 206 is configured to output a second delayed clock signal CKP2 to scan chain control unit 218 or second tracking unit 616b. Timing system 206 is configured to output a first sense amplifier signal SAEx1 to sense amplifier 212 or scan chain control unit 218.

TD Unit 214 is connected to first tracking unit 616a, second tracking unit 616b and scan chain control unit 218. TD unit 214 is configured to receive a clock signal CLK. TD unit 214 is configured to output a first delayed clock signal CKP1 to first tracking unit 616a. TD unit 214 is configured to output a second delayed clock signal CKP2 to second tracking unit 616b or scan chain control unit 218. In some embodiments, the first delayed clock signal CKP1 is substantially equal to the second delayed clock signal CKP2. In some embodiments, the first delayed clock signal CKP1 is a delayed version of the clock signal CLK. In some embodiments, the second delayed clock signal CKP2 is a delayed version of the clock signal CLK. In some embodiments, the second delayed clock signal CKP2 is a delayed version of the first delayed clock signal CKP1. In some embodiments, first delayed clock signal CKP1 and second delayed clock signal CKP2 are generated from a common source. In some embodiments, TD unit 214 includes a clock generator. In some embodiments, TD unit 214 includes one or more timing circuits. In some embodiments, TD unit 214 includes one or more decoder circuits. In some embodiments, first delayed clock signal CKP1 is a first tracking control signal for first tracking unit 616a. In some embodiments, second delayed clock signal CKP2 is a second tracking control signal for second tracking unit 616b.

First tracking unit 616a is connected to TD Unit 214 and sense amplifier 212. First tracking unit 616a is configured to receive first delayed clock signal CKP1. First tracking unit 616a is configured to output first sense amplifier signal SAEx1 to sense amplifier 212. In some embodiments, the first delayed clock signal CKP1 triggers the first tracking unit 616a to generate the first sense amplifier signal SAEx1. In some embodiments, the first tracking unit 616a is configured to control the timing of the sense amplifier 212. In some embodiments, the first tracking unit 616a generates a clock signal (e.g., the first sense amplifier signal SAEx1) which triggers the sense amplifier 212.

Second tracking unit 616b is connected to TD Unit 214 and scan chain control unit 218. Second tracking unit 616b is configured to receive second delayed clock signal CKP2. Second tracking unit 616b is configured to output the second sense amplifier signal SAEx2 to scan chain control unit 218. In some embodiments, the second delayed clock signal CKP2 triggers the second tracking unit 216b to generate the second sense amplifier signal SAEx2. In some embodiments, the second tracking unit 616b is configured to control the timing of the scan chain control unit 218. In some embodiments, the second tracking unit 616b generates a clock signal (e.g., the second sense amplifier signal SAEx2) which triggers the scan control unit 218.

Scan chain control unit 218 is connected to memory core 201 and scan chain 220. Scan chain control unit 218 is connected to TD unit 214, second tracking unit 616b and scan chain 220. Scan chain control unit 218 is configured to receive the second delayed clock signal CKP2 or second sense amplifier signal SAEx2. Scan chain control unit 218 is configured to output a first scan chain control signal CKM or a second scan chain control signal CKS. In some embodiments, the second sense amplifier signal SAEx2 triggers the scan chain control unit 218 to generate the first scan chain control signal CKM or the second scan chain control signal CKS. In some embodiments, scan chain control unit 218 is configured to send the first scan chain control signal CKM or the second scan chain control signal CKS to a first scan chain 220a. In some embodiments, scan chain control unit 218 is configured to send the first scan chain control signal CKM or the second scan chain control signal CKS to a second scan chain 220b. In some embodiments, the first scan chain control signal CKM is a first clock signal for the scan chain 220. In some embodiments, the second scan chain control signal CKS is a second clock signal for the scan chain 220.

Figure 7:
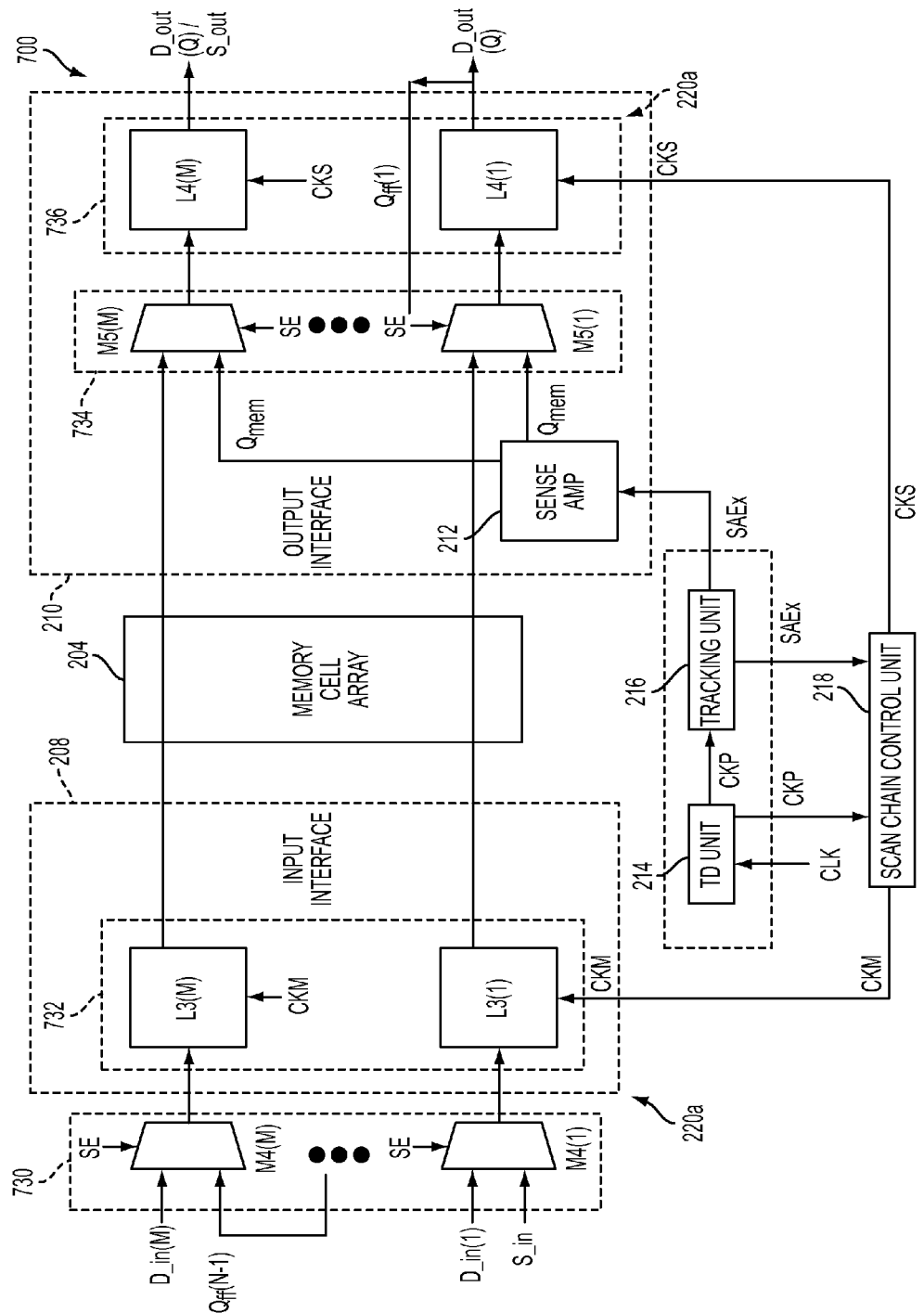
FIG. 7 is a schematic diagram of a portion of a memory unit in accordance with one or more embodiments.

FIG. 7 is a block diagram of a memory unit 700 in accordance with one or more embodiments. Memory unit 700 is an embodiment of the memory unit 200 shown in FIG. 2. As shown in FIG. 7, similar elements have a same reference number as shown in FIG. 2. In comparison with memory unit 200 (shown in FIG. 2), memory unit 700 also comprises an input multiplexer 730, input latch 732, output multiplexer 734 and output latch 736. In some embodiments, input interface 208 comprises input latch 732. In some embodiments, output interface 210 comprises sense amplifier 212, output multiplexer 734 and output latch 736.

The first scan chain 220a comprises input multiplexer 730, input latch 732, output multiplexer 734 and output latch 736. In some embodiments, the first scan chain 220a comprises an input scan chain stage and an output scan chain stage. In some embodiments, the input scan chain stage comprises an input multiplexer 730 and an input latch 732. In some embodiments, the output scan chain stage comprises an output multiplexer 734 and an output latch 736. In some embodiments, input latch 732 is configured to provide a delay or buffering operation for data received by the memory unit 700. In some embodiments, output latch 736 is configured to provide a delay or buffering operation for data output by the memory unit 700.

Input multiplexer 730 comprises one or more stages of input multiplexer M4(1), . . . M4(M), where M is an integer corresponding to the number of stages in the input multiplexer 730. In some embodiments, M is an integer ranging from 1 to 72.

Input multiplexer M4(1) is connected to input latch L3(1). Input multiplexer M4(1) is configured to receive input scan data S_in or input data D_in. Input multiplexer M4(1) is configured to receive a scan enable signal SE. The scan enable signal SE is a low logical value or a high logical value. Input multiplexer M4(1) is configured to output a signal to the input latch L3(1). In some embodiments, the scan enable signal SE controls the operation of the input multiplexer M4(1). In some embodiments, the logical value of scan enable signal SE determines which input signal (e.g., input scan data S_in or input data D_in) is forwarded as the output signal of the input multiplexer M4(1). In some embodiments, a scan enable signal SE of a low logical value results in an input signal of input scan data S_in being forwarded as the output signal of the input multiplexer M4(1). In some embodiments, a scan enable signal SE of a low logical value results in an input signal of input data D_in being forwarded as the output signal of the input multiplexer M4(1).

Each of the connections for the input multiplexer M4(1) repeat for each subsequent stage of the input multiplexer M4(M) contained in the input multiplexer 730.

Input latch 732 comprises one or more stages of input latch L3(1), . . . L3(M), where M is an integer corresponding to the number of stages in the input multiplexer 730.

Input latch L3(1) is connected to input multiplexer M4(1), output interface 210 and scan chain control unit 218. Input latch L3(1) is configured to receive an input signal (e.g., input scan data S_in or input data D_in) from input multiplexer M4(1). Input latch L3(1) is configured to receive the first scan chain control signal CKM from the scan chain control unit 218. Input latch L3(1) is configured to output a signal to the output interface 210 (by the output multiplexer M5(1)). In some embodiments, the input latch L3(1) is configured as a low-latch or a high-latch. In some embodiments, if the first scan chain control signal CKM is a low logical signal and the input latch L3(1) is configured as a low-latch, the input signal received from the input multiplexer M4(1) is output by the input latch L3(1). In some embodiments, if the first scan chain control signal CKM is a high logical signal and the input latch L3(1) is configured as a high-latch, the input signal received from the input multiplexer M4(1) is output by the input latch L3(1). In some embodiments, the first scan chain control signal CKM is a clock signal for the input latch L3(1).

Each of the connections for the input latch L3(1) repeat for each subsequent stage of the input latch L3(M) contained in the input latch 732.

Output multiplexer 734 comprises one or more stages of output multiplexer M5(1), . . . M5(M), where M is an integer corresponding to the number of stages in the output multiplexer 734.

Output multiplexer M5(1) is connected to the input interface 208, the sense amplifier 212 and the output latch L4(1). Output multiplexer M5(1) is configured to receive a signal from input interface 208. Output multiplexer M5(1) is configured to receive signal $Q_{mem}$ from sense amplifier 212. In some embodiments, output multiplexer M5(1) is configured to receive scan enable signal SE. The scan enable signal SE is a low logical value or a high logical value. In some embodiments, the scan enable signal SE controls the operation of the output multiplexer M5(1). Output multiplexer M5(1) is configured to output a signal to output latch L4(1). In some embodiments, the logical value of scan enable signal SE determines which input signal (e.g., input scan data S_in, input data D_in or signal Qmem) is forwarded as the output signal of the output multiplexer M5(1). In some embodiments, a scan enable signal SE of a low logical value results in input scan data S_in being forwarded as the output signal of the output multiplexer M5(1). In some embodiments, a scan enable signal SE of a low logical value results in input data D_in being forwarded as the output signal of the output multiplexer M5(1). In some embodiments, a scan enable signal SE of a low logical value results in signal Qmem being forwarded as the output signal of the output multiplexer M5(1).

Each of the connections for the output multiplexer M5(1) repeat for each subsequent stage of the output multiplexer M5(M) contained in the output multiplexer 734.

Output latch 736 comprises one or more stages of output latch L4(1), . . . L4(M), where M is an integer corresponding to the number of stages in the output latch 736.

Output latch L4(1) is connected to first latch L1(1), scan chain control unit 218 and output multiplexer M5(1). Output latch L4(1) is configured to receive an input signal from output multiplexer M5(1). Output latch L4(1) is configured to receive the second scan chain control signal CKS from the scan chain control unit 218. Output latch L4(1) is configured to output data signal D_out (Q). In some embodiments, output latch L4(1) is configured to output bypass signal $Q_{\mathit{f\!f}}(1)$ to the subsequent stage of the input multiplexer M4(M). In some embodiments, output data signal D_out (Q) is substantially equal to the bypass signal $Q_{\mathit{f\!f}}(1)$.

In some embodiments, the output latch L4(1) is configured as a low-latch or a high-latch. In some embodiments, if the second scan chain control signal CKS is a low logical signal and the output latch L4(1) is configured as a low-latch, the input signal received from the output multiplexer M5(1) is output by the output latch L4(1). In some embodiments, if the second scan chain control signal CKS is a high logical signal and the output latch L4(1) is configured as a high-latch, the input signal received from the output multiplexer M5(1) is output by the output latch L4(1). In some embodiments, the second scan chain control signal CKS is a clock signal for the output latch L4(1). In some embodiments, the second scan chain control signal CKS triggers the output latch L4(1) to generate the output signal D_out (Q).

Each of the connections for the output latch L4(1) repeat for each subsequent stage of the output latch L4(M) contained in the output latch 736. The last stage of the output latch L4(M) is configured to output data signal D_out (Q). In some embodiments, the last stage of the output multiplexer L4(M) is configured to output a scan signal S_out. In some embodiments, the second scan chain control signal CKS triggers the output latch L4(M) to generate the output scan data S_out.

Figure 8:
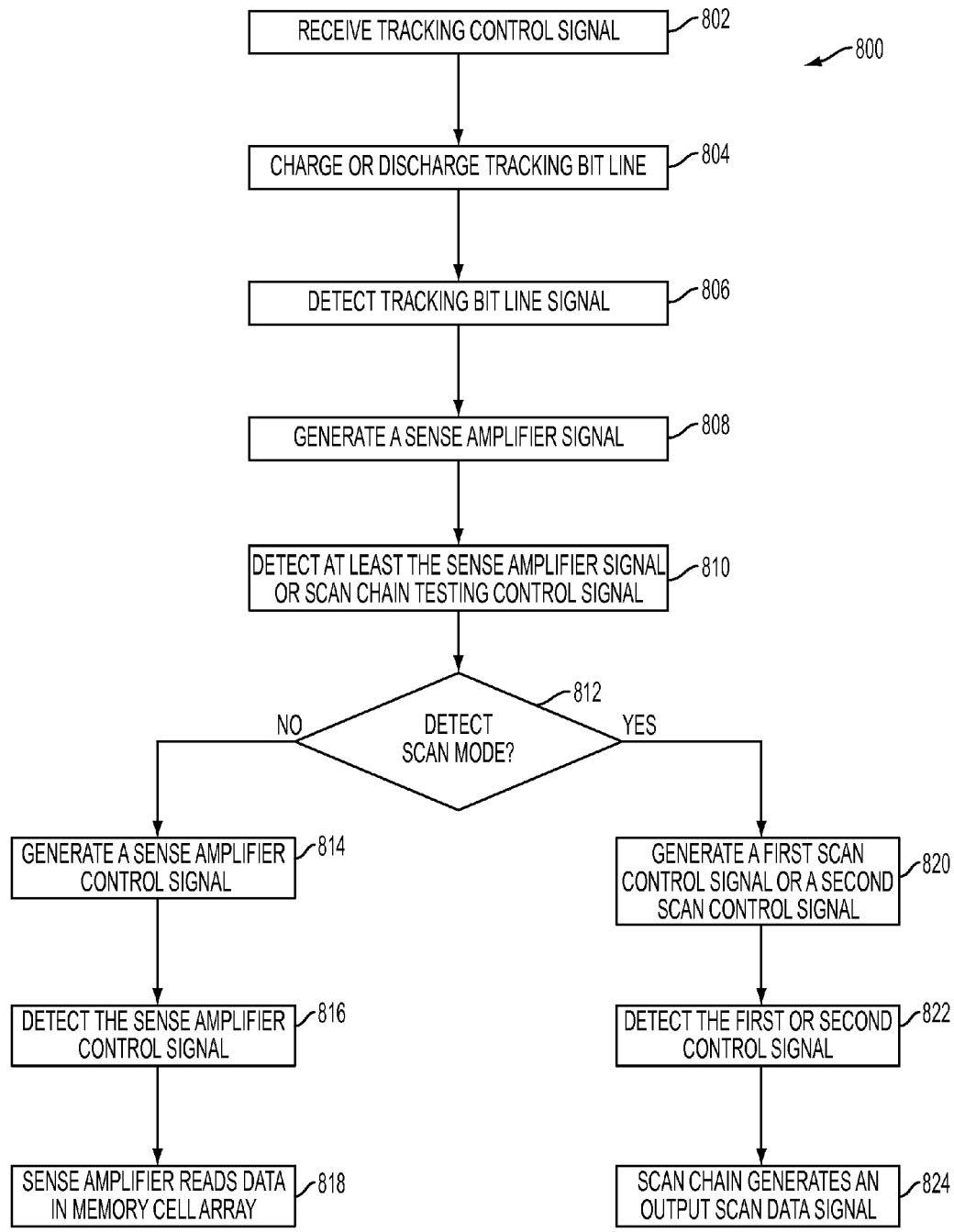
FIG. 8 is a flow chart illustrating a method in accordance with one or more embodiments.

FIG. 8 is a flow chart illustrating a method 800 of testing a scan chain memory unit in accordance with one or more embodiments. Method 800 begins with operation 802 in which a tracking control signal is received by a tracking unit, e.g., tracking unit 216.

In operation 804, a voltage is selectively charged or discharged on a tracking bit line, e.g., tracking bit line TBL.

In operation 806, the voltage on the tracking bit line is detected. In some embodiments, the voltage on the tracking bit line, e.g., bitline signal TRKBL, is received by an inverter, e.g. inverter I1.

In operation 808, a sense amplifier signal, e.g., sense amplifier signal SAEx, is generated by the tracking unit, e.g., tracking unit 216, in response to the voltage on the tracking bit line.

In operation 810, the sense amplifier signal, e.g., sense amplifier signal SAEx, or the scan chain testing control signal, scan chain testing control signal DFTEN, are detected. In some embodiments, the sense amplifier signal is received by the scan chain control unit, e.g., scan chain control unit 218. In some embodiments, the sense amplifier signal is received by the sense amplifier, e.g., sense amplifier 212. In some embodiments, the scan chain testing control signal is received by the scan chain control unit, e.g., scan chain control unit 218. In some embodiments, the scan chain testing control signal is received by the sense amplifier, e.g., sense amplifier 212.

In operation 812, a mode of operation of the memory unit, e.g., memory unit 200, is detected. In some embodiments, the mode of operation of the memory unit is a read/write mode. In some embodiments, the mode of operation of the memory unit is a scan chain test mode. In some embodiments, if the mode of operation of the memory unit is a read/write mode, the operation proceeds to operation 814. In some embodiments, if the mode of operation of the memory unit is a scan chain test mode, the operation proceeds to operation 820. In some embodiments, if the scan chain testing control signal is a low logical value, the memory unit is configured to operate in a read/write mode. In some embodiments, if the scan chain testing control signal is a high logical value, the memory unit is configured to operate in a scan chain test mode.

In operation 814, a sense amplifier control signal, e.g., sense amplifier control signal SAE, is generated in response to at least the scan chain testing control signal, e.g., scan chain testing control signal DFTEN. In some embodiments, the sense amplifier control signal, e.g., sense amplifier control signal SAE, is generated by the sense amplifier, e.g., sense amplifier 212.

In operation 816, the sense amplifier control signal, e.g., sense amplifier control signal SAE, is detected by a sense amplifier circuit, e.g., sense amplifier circuit 412a. In some embodiments, the sense amplifier control signal is received by a sense amplifier circuit, e.g., sense amplifier circuit 412a.

In operation 818, a read operation is performed of a memory cell array, e.g., memory cell array 208, in response to the sense amplifier control signal, e.g., sense amplifier control signal SAE. In some embodiments, the read operation is performed by a sense amplifier circuit, e.g., sense amplifier circuit 412a.

In operation 820, a first scan chain control signal, e.g., first scan chain control signal CKM, or a second scan chain control signal, e.g., second scan chain control signal CKS, is generated in response to the sense amplifier signal, e.g., sense amplifier signal SAEx, or the scan chain testing control signal, e.g., scan chain testing control signal DFTEN. In some embodiments, the first scan chain control signal or the second scan chain control signal is generated by the scan chain control unit, e.g., scan chain control unit 218.

In operation 822, the first scan chain control signal, e.g., first scan chain control signal CKM, or a second scan chain control signal, e.g., second scan chain control signal CKS, is detected by the scan chain, e.g., scan chain 220. In some embodiments, the first scan chain control signal or the second scan chain control signal are received by the scan chain.

In operation 824, an output scan data signal, e.g., output scan data signal S_out is generated by the scan chain, e.g., scan chain 220.

One aspect of this description relates to a memory unit comprising a tracking unit, a scan chain and a scan chain control unit. The tracking unit comprises a tracking bit line, wherein the tracking unit is configured to receive a tracking control signal, selectively charge or discharge a voltage on the tracking bit line in response to the tracking control signal and generate a sense amplifier signal. The scan chain comprises one or more logic devices, wherein the scan chain is configured to receive at least a first control signal. The scan chain control unit is connected to the scan chain and the tracking unit. The scan chain control unit is configured to receive the sense amplifier signal and generate the first scan chain control signal.

Another aspect of this description relates to a memory unit comprising a first tracking unit, a second tracking unit, a scan chain and a scan chain control unit. The first tracking unit comprises a tracking bit line, wherein the first tracking unit is configured to receive a first tracking control signal, selectively charge or discharge a voltage on the tracking bit line in response to the first tracking control signal and generate a first sense amplifier signal. The second tracking unit is configured to receive a second tracking control signal and to generate a second sense amplifier signal. The scan chain comprises two or more logic devices connected sequentially, wherein the scan chain is configured to receive a first scan chain clock signal and a second scan chain clock signal. The scan chain control unit is connected to each of the scan chain, the first tracking unit and the second tracking unit. The scan chain control unit is configured to receive the second sense amplifier signal and generate the first scan chain clock signal and the second scan chain clock signal.

Still another aspect of this description relates to method of testing a memory unit. The method of testing the memory unit comprises receiving a tracking control signal, selectively charging or discharging a voltage on a tracking bit line, generating a sense amplifier signal in response to the voltage on the tracking bit line, receiving the sense amplifier signal, receiving a scan chain testing control signal, determining a mode of operation of the memory unit, generating a first scan chain control signal in response to the sense amplifier signal or the scan chain testing control signal if the mode of operation is a scan chain mode and receiving the first scan chain control signal if the mode of operation is the scan chain mode.

One of ordinary skill in the art would recognize that an order of operations in method 800 is adjustable. One of ordinary skill in the art would further recognize that additional steps are able to be included in method 800 without departing from the scope of this description.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory unit, comprising:
   a tracking unit comprising a tracking bit line, wherein the tracking unit is configured to:
   receive a tracking control signal;
   selectively charge or discharge a voltage on the tracking bit line in response to the tracking control signal; and
   generate a sense amplifier signal;
   a scan chain, wherein the scan chain comprises one or more logic devices, wherein the scan chain is configured to receive at least a first control signal; and
   a scan chain control unit connected to the scan chain and the tracking unit, wherein the scan chain control unit is configured to:
   receive the sense amplifier signal; and
   generate a first scan chain control signal.

2. The memory unit of claim 1, further comprising a sense amplifier connected to the tracking unit, wherein the sense amplifier is configured to receive the sense amplifier signal.

3. The memory unit of claim 1, wherein the scan chain control unit is configured to generate a second scan chain control signal.

4. The memory unit of claim 1, wherein the scan chain control unit is configured to receive a scan chain testing control signal, wherein the scan chain testing control signal triggers the scan chain control unit to generate the first scan chain control signal.

5. The memory unit of claim 3, wherein the scan chain control unit is configured to receive a scan chain testing control signal, the scan chain testing control signal triggers the scan chain control unit to generate the second scan chain control signal.

6. The memory unit of claim 3, wherein the scan chain control unit is configured to generate the first scan chain control signal or the second scan chain control signal in response to the sense amplifier signal.

7. The memory unit of claim 2, further comprising:
   a sensing circuit connected to the sense amplifier, wherein the sense amplifier is configured to receive a scan chain testing control signal and the sense amplifier is configured to output a sense amplifier control signal to the sensing circuit in response to the scan chain testing control signal.

8. The memory unit of claim 7, further comprising a memory cell array, wherein:
   the memory cell array is connected to the sensing circuit; and
   the sensing circuit is configured to perform a read operation of the memory cell array in response to the sense amplifier control signal.

9. A memory unit, comprising:
   a first tracking unit comprising a tracking bit line, wherein the first tracking unit is configured to:
   receive a first tracking control signal;
   selectively charge or discharge a voltage on the tracking bit line in response to the first tracking control signal; and
   generate a first sense amplifier signal;
   a second tracking unit, wherein the second tracking unit is configured to:
   receive a second tracking control signal; and
   generate a second sense amplifier signal;
   a scan chain, wherein the scan chain comprises two or more logic devices connected sequentially, wherein the scan chain is configured to receive a first scan chain clock signal and a second scan chain clock signal; and
   a scan chain control unit is connected to each of the scan chain, the first tracking unit and the second tracking unit, wherein the scan chain control unit is configured to:
   receive the second sense amplifier signal; and
   generate the first scan chain clock signal and the second scan chain clock signal.

10. The memory unit of claim 9, wherein the scan chain control unit is configured to receive a scan chain testing control signal, wherein the scan chain testing control signal triggers the scan chain control unit to generate a first scan chain control signal or a second scan chain control signal.

11. The memory unit of claim 9, wherein the scan chain control unit is configured to generate a first scan chain control signal or a second scan chain control signal in response to the second sense amplifier signal.

12. The memory unit of claim 9, further comprising:
    a sense amplifier connected to the first tracking unit;
    a sensing circuit connected to the sense amplifier, wherein the sense amplifier is configured to receive a scan chain testing control signal and the sense amplifier is configured to output a sense amplifier control signal to the sensing circuit in response to the scan chain testing control signal.

13. The memory unit of claim 9, wherein the scan chain comprises a flip-flop device.

14. The memory unit of claim 13, wherein the flip-flop device comprises a first latch device and a second latch device.

15. The memory unit of claim 9, wherein the scan chain comprises a first latch device and a second latch device.

16. The memory unit of claim 15, wherein the scan chain further comprises:
    an input multiplexer connected to the first latch; and
    an output multiplexer connected to the second latch.

17. The memory unit of claim 9, wherein the memory unit is a static-random access memory (SRAM).

18. A method of testing a memory unit, the method comprising:
    receiving a tracking control signal;
    selectively charging or discharging a voltage on a tracking bit line;
    generating a sense amplifier signal in response to the voltage on the tracking bit line;
    receiving the sense amplifier signal;
    receiving a scan chain testing control signal;
    determining a mode of operation of the memory unit;
    generating a first scan chain control signal in response to the sense amplifier signal or the scan chain testing control signal if the mode of operation is a scan chain mode; and
    receiving the first scan chain control signal if the mode of operation is the scan chain mode.

19. The method of claim 18, further comprising:
    generating a second scan chain control signal in response to the sense amplifier signal or the scan chain testing control signal if the mode of operation is the scan chain mode; and
    receiving the second scan chain control signal if the mode of operation is the scan chain mode.

20. The method of claim 18, further comprising:
generating a sense amplifier control signal in response to at least the scan chain testing control signal if the mode of operation is a read mode;
receiving the sense amplifier control signal if the mode of operation is the read mode; and
performing a read operation of a memory cell array in response to the sense amplifier control signal if the mode of operation is the read mode.

* * * * *